US006166676A

United States Patent [19]
Iizuka

[11] Patent Number: 6,166,676
[45] Date of Patent: Dec. 26, 2000

[54] CORRELATING DEVICE AND SLIDING CORRELATING DEVICE USING THE SAME

[75] Inventor: Kunihiko Iizuka, Sakurai, Japan

[73] Assignee: Sharp Kabushiki Kaisha, Osaka, Japan

[21] Appl. No.: 09/179,099

[22] Filed: Oct. 27, 1998

[30] Foreign Application Priority Data

Oct. 28, 1997 [JP] Japan .................................... 9-295816

[51] Int. Cl.[7] ...................................................... H03M 1/12
[52] U.S. Cl. ............................................................ 341/172
[58] Field of Search ................................................ 341/172

[56] References Cited

U.S. PATENT DOCUMENTS 5,392,043 2/1995 Ribner ..................................... 341/172

FOREIGN PATENT DOCUMENTS 03224329 3/1991 Japan .

*Primary Examiner*—Trong Phan
*Attorney, Agent, or Firm*—Dike, Bronstein, Roberts & Cushman, LLP; David G. Conlin

[57] ABSTRACT

In a correlating device, two switched-capacitor-type analog signal integrators are connected in cascade. The analog signal integrator in the first stage samples an analog input voltage at a predetermined cycle, determines the sign of the sampled value according to a binary-code sequence, integrates the sampled value, and outputs the resultant value. The analog signal integrator in the next stage samples an input voltage at a reset cycle of the analog signal integrator in the first stage, integrates the sampled value, and outputs the resultant value. This structure can prevent saturation of the correlating device without decreasing the gain of each analog signal integrator to a greet degree even when the sequence length becomes longer. Therefore, even if a high operation speed is required and if the sequence length of the binary-code sequence becomes longer, it is possible to provide a correlating device capable of achieving both an improvement of the operation accuracy and a reduction in the power consumption at a time.

11 Claims, 9 Drawing Sheets

CORRELATING DEVICE AND SLIDING CORRELATING DEVICE USING THE SAME

FIELD OF THE INVENTION

The present invention relates to a sliding correlating device for calculating the correlation between an analog input signal and a binary-code sequence with respect to time, which is suitable for use as a sliding correlating device for synchronizing an input signal and a binary-code sequence, or a correlating device for demodulating spread data into the original form, for example, in spread spectrum communications.

BACKGROUND OF THE INVENTION

In a conventional correlating device for use in spread spectrum communications, a method in which the correlation between an input signal and a binary-code sequence is calculated by converting the input signal in analog form into a digital signal (AD conversion) and then performing a digital operation, is mainly used. However, in this method, since an AD convertor is required, the circuit structure is complicated. Consequently, it is difficult to achieve a compact low-power-consuming correlating device with this method.

Therefore, for example, a correlating device which directly calculates the correlation by means of an analog circuit tends to be used as described in, for example, Japanese laid-open publication (Tokukaihei) No. 3-224329. For example, as shown in FIG. 9, in such a correlating device 101, an alternating current component of an analog input voltage Vin is converted into a current signal by a differentiating circuit 102, and then input to a switch 103. The current signal is input to an analog signal integrator 104 only when the switch 103 is closed. Here, closing and opening of the switch 103 is controlled by a binary-code sequence signal C_PN given by a binary-code sequence generator 105. Thus, the correlating device 101 can give the correlation between the alternating current component of the input signal and the binary-code sequence with respect to time by calculating the sum of products of the alternating current component of the input signal and the binary-code sequence.

With this structure, the correlation can be calculated without converting the input signal into a digital signal. It is therefore possible to realize a correlating device that is more compact and consumes less power compared to a correlating device which requires an AD converter and calculates the correlation by a digital operation.

However, in the case when a correlating device is realized by an analog circuit, as the binary-code sequence becomes longer, it is more difficult to achieve both an improvement of the operation accuracy and a lowering of the power consumption.

More specifically, in order to retain the integrated value, the analog signal integrator 104 includes a capacitance such as a capacitor. Hence, the capacitance of the capacitor needs to be set at a value at which saturation does not occur before completing the correlation operation.

However, when integrating the correlating device into an IC (integrated circuit), it is difficult to make the capacitance of the capacitor greater than a certain value. When the capacitance is increased, the operable speed decreases unless the value of a current charged to and discharged from the capacitance is increased, i.e., the power consumption is increased. On the other hand, even when the capacitance is relatively small, in order to prevent saturation, the gain of the analog signal integrator 104 needs to be set at a small value. In this case, as the binary-code sequence length becomes longer, it is necessary to decrease the gain. Therefore, the S/N ratio of the analog signal integrator 104 is reduced, and the operation accuracy of the correlating device 101 is lowered.

Here, in order to improve the accuracy of calculating the correlation, a correlating device using a switched-capacitor-type analog signal integrator 111 shown in FIG. 10 and a multiplexer is also used. More specifically, in a correlating device 121 shown in FIG. 11, a sampling circuit 122 accumulates charge corresponding to the analog input signal Vin in a sampling capacitor C1 according to a sampling control signal C_SP shown in FIG. 12. Moreover, a multiplexer 124 applies the accumulated amount of charge to the analog signal integrator 123 as it is or after inverting its sign according to a binary-code sequence signal C_PN. The multiplexer 124 shown in FIG. 11 is connected to a negative input terminal and a positive input terminal of an operational amplifier A1 in an analog signal integrator 123 similar to the analog signal integrator 111 shown in FIG. 10.

In this structure, charge accumulated in a feedback capacitor C2 provided between the input and output of the operational amplifier A1 is discharged by a switch SW125 at the time a dump control signal C_DP instructs to start the binary-code sequence. Thus, the correlating device 121 can output the correlation from a time point at which the dump control signal C_DP instructs to start the binary-code sequence. Here, the correlating device 121 calculates the sum of products based on the analog input voltage Vin at the time of sampling. Consequently, the operation error due to a variation in the analog input voltage Vin at times other than sampling can be reduced, thereby improving the operation accuracy.

However, even in the correlating device 121 having the above-mentioned structure, if the gain of the analog signal integrator 123 is not made smaller as the binary-code sequence length increases, the feedback capacitor C2 saturates.

More specifically, if C1 is decreased to reduce the gain (C1/C2) of the analog signal integrator 123, the S/N ratio of the correlating device 121 deteriorates due to clock field through noise (to be described later), ktC noise, etc. The ktC noise is generated by thermal noise of the switch in the sampling circuit 122. On the other hand, if C2 is increased to reduce the gain, the load capacitance of the operational amplifier A1 increases. Thus, if the power consumption of the operational amplifier A1 is not increased, the operation speed of the analog signal integrator 123 is lowered.

More specifically, denoting the length of binary-code sequence by n, when the analog input voltage Vin of signal amplitude |Vin| and the binary-code sequence have the maximum correlation, the output voltage of the analog signal integrator 123 is a maximum Vmax [V] given by equation (1):

$$Vmax = n \cdot C1/C2 \cdot |Vin| \quad (1).$$

Therefore, if the value Vmax is not within a range of voltage that can be output by the analog signal integrator 123, the correlating device 121 can not output an accurate correlation.

Here, it is arranged as an example that the sequence length n is 128, the range of voltage that can be output by the analog signal integrator 123 is 1.5 [V]±1.0 [v], the reference electric potential of the analog input voltage Vin is 1.5 [V], and the amplitude of the analog input voltage Vin is ±1 [V]. In this case, for example, when the sampling capacitor C1 is set at 1 [pF], the feedback capacitor C2 of the analog signal integrator 123 needs to satisfy the relation C2>128 [pF] because the maximum Vmax+1.5 [V]<2.5 [V]. The feedback capacitor C2 is an output load of the operational amplifier A1, and causes a lowering of the operation speed or an increase in the power consumption.

Meanwhile, under the same conditions, when the feedback capacitor C2 is set at, for example, 5 [pF], the capacitance of the sampling capacitor C1 is limited to C1<0.019 [pF]. Here, in the case where the switch of the sampling circuit 122 is formed by a CMOS (metal oxide semiconductor), if the gate length and gate width of NMOS is 1 [$\mu$m] and 2 [$\mu$m] and the gate length and gate width of PMOS is 1 [$\mu$m] and 4 [$\mu$m], respectively, the sum of the parasitic capacitance between the gate and source of the two MOSs is approximately around 5 [fF] to 10 [fF]. Accordingly, the ratio of the capacitance of the gate parasitic capacitor of a transistor constituting both the switches to the capacitance of the sampling capacitor C1 is less than one figure. As a result, the S/N ratio of the analog signal integrator 123 is lowered due to a phenomenon that the charge accumulated in the gate parasitic capacitor is mixed with charge accumulated in the sampling capacitor at the time the switch is opened or closed, i.e., the clock field through phenomenon.

In spread spectrum communications as a suitable application of a correlating device, the communication speed is increasing and the length of binary-code sequence is being made longer. Furthermore, since the terminals for communications are often carried, there is great demand for a lowering of power consumption.

However, as described above, in the conventional correlating devices 101 and 121, when calculating the correlation between an input signal and a lengthy binary-code sequence at a high speed, it is extremely difficult to avoid both of a lowering of the operation speed and an increase in the power consumption.

SUMMARY OF THE INVENTION

It is an object of the present invention to realize a correlating device capable of achieving both an improvement of the operation accuracy and a reduction in the power consumption even when a high speed operation is required and the sequence length of a binary-code sequence becomes longer.

In order to achieve the above object, a correlating device of the present invention for calculating the correlation between an analog input signal and a binary-code sequence with respect to time, is characterized by including an integrating section provided with integrating capacitors for accumulating charge corresponding to an integral value, for integrating an amount of charge corresponding to the analog input signal, the charge having a sign corresponding to the binary-code sequence, wherein the integrating section includes a plurality of switched-capacitor-type analog signal integrators connected to each other in cascade, and charge accumulated in an integrating capacitor of each switched-capacitor-type analog signal integrator is reset every time sampling is performed in the next stage.

A predetermined amount of charge of a predetermined sign is given to the integrating section by accumulating an amount of charge corresponding to an analog input signal in a sampling capacitor, and by, for example, setting the sign of charge using a multiplexer provided in front of or after the sampling capacitor, etc. As a result, an amount of charge having the same sign as or the opposite sign to the analog input signal is given to the integrating section, according to the binary-code sequence.

In this structure, for example, the switched-capacitor-type analog signal integrator in the first stage samples and integrates the analog input signal at a predetermined frequency. Charge is applied to the integrating capacitor of the analog signal integrator whenever sampling and integration are repeated. The amount and sign of charge applied accord with the correlation between the analog input signal at the time of sampling and the binary-code sequence corresponding to that time.

Meanwhile, the analog signal integrator in a stage after the first stage samples an output of the analog signal integrator in the previous stage, integrates the sampled value, and outputs the resultant value. Each analog signal integrator resets the charge accumulated in its own capacitor every time the analog signal integrator in the next stage performs sampling, for example, every sampling point of the analog signal integrator in the next stage.

Consequently, the analog signal integrator in the final stage can calculate the correlation between the binary-code sequence and the analog input signal with respect to time.

Since the respective analog signal integrators are connected to each other in cascade, it is possible to reduce the overall gain without decreasing the gain of each of the analog signal integrators to a great degree. As a result, in each of the analog signal integrators, the capacitance of the integrating capacitor can be significantly reduced while maintaining the operation accuracy, without causing deterioration of the S/N ratio due to clock field through noise, ktC noise, etc.

Moreover, each of the analog signal integrators is reset every time sampling is performed in the next stage. Therefore, the number of times sampling is performed by each analog signal integrator per reset time is much smaller compared to the sequence length of the binary-code sequence. Thus, even when the gain of the analog signal integrator is relatively large, it is possible to prevent saturation of the integrating capacitor and accurately calculate the correlation between the analog input signal and the binary-code sequence.

In general, when the operation speed is uniform, the power consumption of the analog signal integrator is substantially proportional to the integrating capacitance. It is therefore possible to reduce the power consumption of each analog signal integrator significantly as compared to the conventional analog correlating device.

Here, the overall gain of the analog signal integrators is determined by the product of the gains of the respective analog signal integrators. Therefore, the total value of the integrating capacitances of the respective analog signal integrators is much smaller than the conventional correlating device. Hence, even when the sequence length of the binary-code sequence becomes longer, it is possible to realize a correlating device capable of preventing both of an increase in the power consumption and deterioration of the operation accuracy.

In addition, since the total value of the integrating capacitances in the correlating device can be reduced, the correlating device can be easily integrated into an integrated circuit. As a result, a compact and low-power-consuming correlating device with high operation accuracy is realized irrespective of the sequence length of the binary-bode sequence.

By the way, according to the above-mentioned structure, since the analog signal integrators are connected in cascade, the output of the correlating device varies depending on the sampling frequency of the analog signal integrator in the final stage without regard to the degree of the correlation between the binary-code sequence and the analog signal integrator. Hence, there is a possibility that the time for waiting for a change in the output of the correlating device becomes longer as the number of stages increases.

Consequently, in the case where a higher operation speed is required, it is preferred to include a partial sequence correlation output terminal that is connected to at least one of the analog signal integrators, which is located in a stage other than the final stage, as well as the above-mentioned structure.

In this structure, the output of at least one of the analog signal integrators, which is located in a stage other than the final stage, is output from the partial sequence correlation output terminal. This output indicates the correlation between the binary-code sequence and the analog input signal in a period between the reset of the analog signal integrator and the previous sampling point. It is thus possible to predict the maximum value of the correlation between the analog input signal and the entire binary-code sequence based, for example, on the correlation therebetween (the correlation between the analog input signal and the partial sequence) in the above-mentioned period. Consequently, it is possible to take a measure corresponding to the predict, for example, terminate the correlation operation in the case when the output exceeds a predetermined value.

Thus, the value of the correlation can be predicted to a certain extent before calculating the correlation between the analog input signal and the entire binary-code sequence, thereby shortening the processing time. Moreover, it is possible to predict the correlation in real time by extracting the output of an earlier stage, for example, the output of the analog signal integrator in the first stage, from the partial sequence correlation output terminal.

Furthermore, in addition to the above-mentioned respective structures, it is preferred that the correlating device includes a power supply terminating section for terminating the supply of power to at least one specific analog signal integrator among the analog signal integrators, which is located in a stage other than the first stage, in a down period during which the neither the integration operation nor the initialization operation is performed.

With this structure, the power supply terminating section stops the supply of power to the specific analog signal integrator by, for example, cutting the bias current during the down period. Since the specific analog signal integrator does not perform an initialization operation nor an integration operation during the down period, there is no need to charge or discharge the integrating capacitor. Therefore, even when the supply of power is stopped, the charge accumulated in the integrating capacitor is retained and does not affect the output value of the specific analog signal integrator at the time of integration.

On the other hand, the power supply terminating section does not interfere with the supply of power in a period (operation period) in which the integrating capacitor of the specific analog signal integrator needs to be charged or discharged, such as during initialization and sampling. Thus, the specific analog signal integrator can integrate the sampled input signal and discharge the integrating charge accumulated in the integrating capacitor without any hindrance.

Here, the later the stage of the analog signal integrator, the lower the sampling frequency and the greater the ratio of the down period to the operation period. Consequently, this structure can reduce the average overall power consumption of the correlating device to a much greater degree than a structure in which power is always supplied to the respective analog signal integrators, without lowering the operation accuracy of the correlation operation.

Besides, since the specific signal integrator is an analog signal integrator located in a stage after the first stage, the sampling frequency is lower than that of the analog signal integrator in the first stage. Therefore, even when the operation speed of the specific analog signal integrator is lowered due to the intermittent supply of power, it is possible to sample the input signal and integrate the sampled value.

By the way, this analog signal integrator can be realized by various types of operational amplifiers such as a single-ended operational amplifier and fully differential amplifier. However, in the case when the single-ended operational amplifier is used, the S/N ratio may be lowered and a sufficient dynamic range may not be ensured due to mismatching of input and output currents.

Therefore, in the case when a greater dynamic range is desired, it is preferred that the analog signal integrator of each of the above-mentioned structures includes a fully differential amplifier with a differential input and a differential output.

Each analog signal integrator having the above-mentioned structure samples and integrates an input signal by fully differential signal processing. As a result, the dynamic range of the correlating device can be expanded. Moreover, since the current flowing into each analog signal integrator and the current output therefrom are balanced on both the input side and the output side, it is possible to further improve the S/N ratio of the correlating device.

Furthermore, an example of suitable application of a correlating device according to each of the above-mentioned structure is a sliding correlating device. More specifically, the sliding correlating device includes a code generator for generating a binary-code sequence according to a specified phase, and a control section for calculating the correlation between the input analog signal and each phase of the binary-code sequence with respect to time while shifting the phase of the binary-code sequence, as well as the correlating device of any of the above-mentioned structure.

In this structure, the correlating device calculates the correlation between the binary-code sequence generated by the code generator and the analog input signal. When the correlation is calculated once, the control section initializes the correlating device, and instructs the code generator to change the phase difference between the analog input signal and the binary-code sequence. As a result, the sliding correlating device can calculate the correlation between the analog input signal and the binary-code sequence while changing the phase difference therebetween every correlation operation.

According to the correlating device of the above-mentioned structure, even when the sequence length of the binary-code sequence becomes longer, it is possible to highly accurately calculate the correlation at a high speed. In addition, since the total value of the integrating capacitances is limited, the correlating device can be easily integrated. It is therefore possible to achieve a sliding correlating device capable of calculating the correlation at a high speed with high accuracy and low power consumption.

For a fuller understanding of the nature and advantages of the invention, reference should be made to the ensuing detailed description taken in conjunction with the accompanying drawings.

DESCRIPTION OF THE PREFERRED EMBODIMENTS

Embodiment 1

Figure 1:
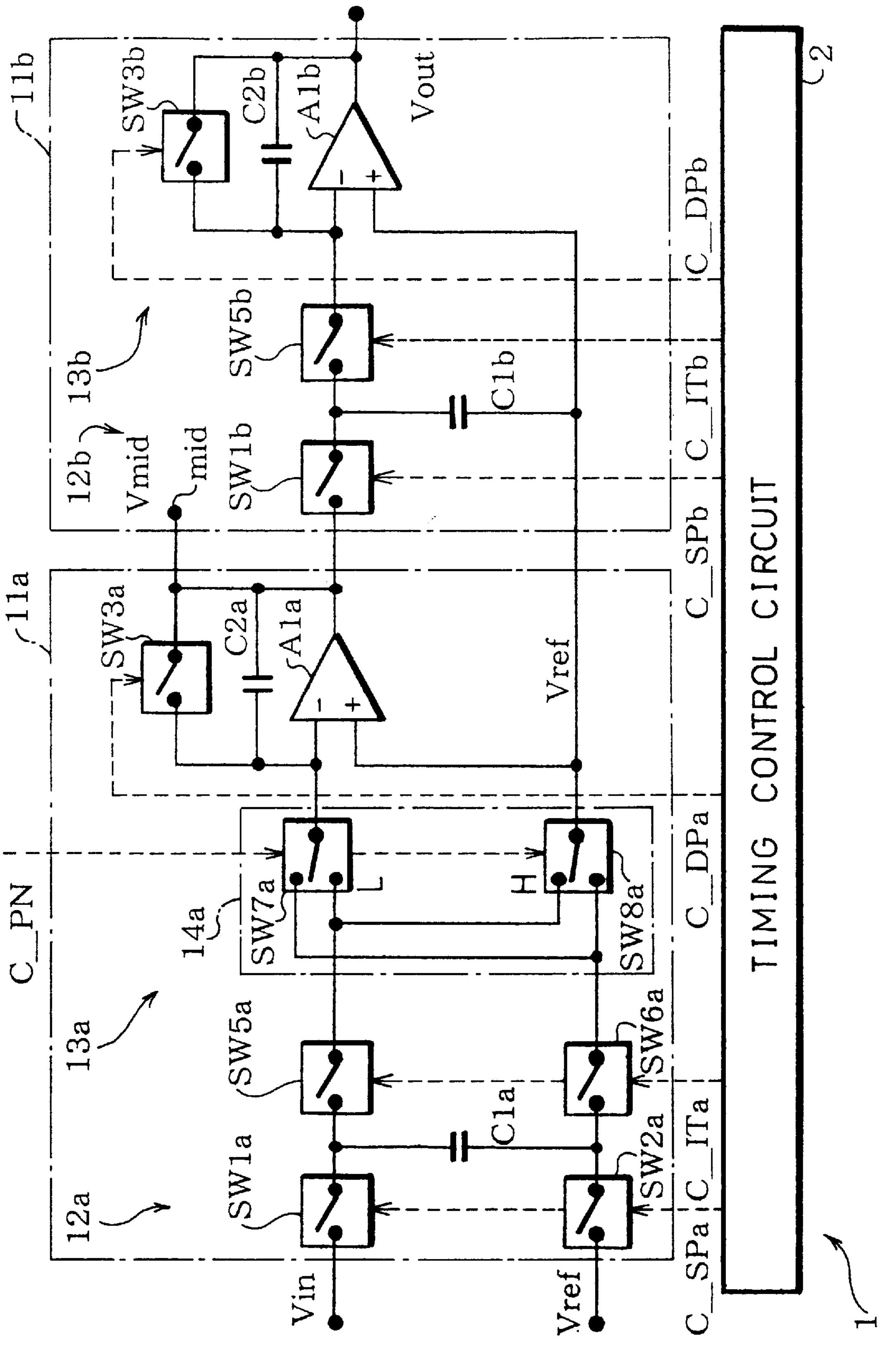
FIG. 1 is a circuit diagram showing the structure of an essential section of a correlating device according to one embodiment of the present invention.
Figure 2:
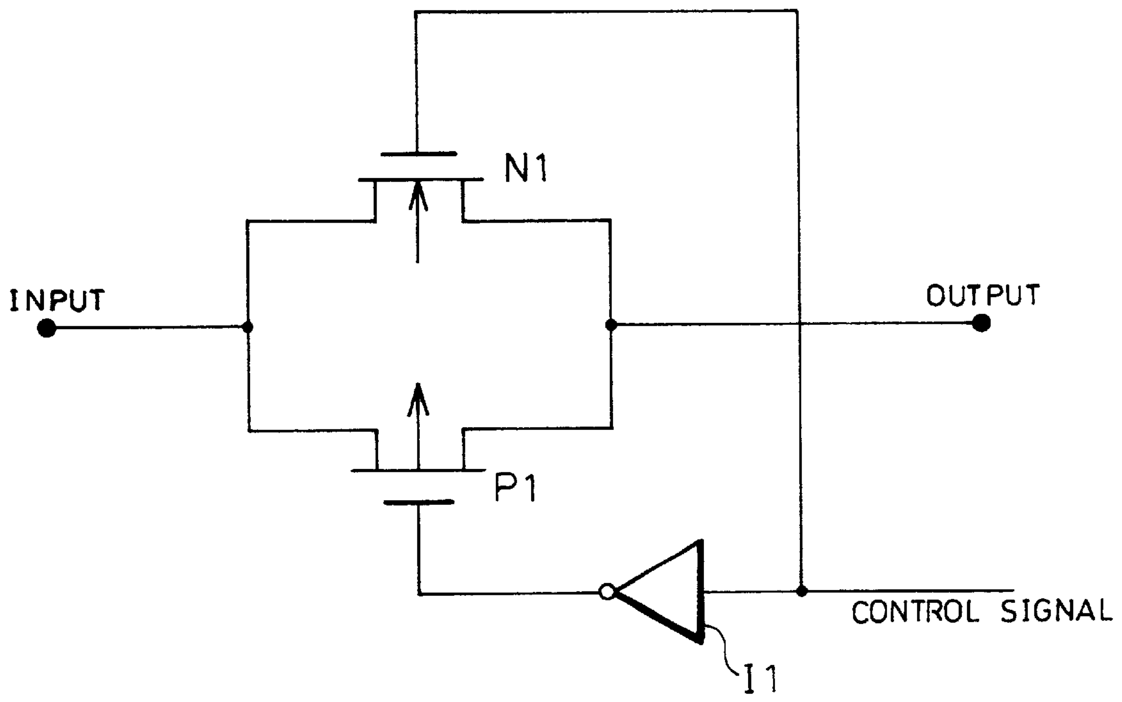
FIG. 2 is a circuit diagram showing an example of the structure of a switch provided in the correlating device.
Figure 3:
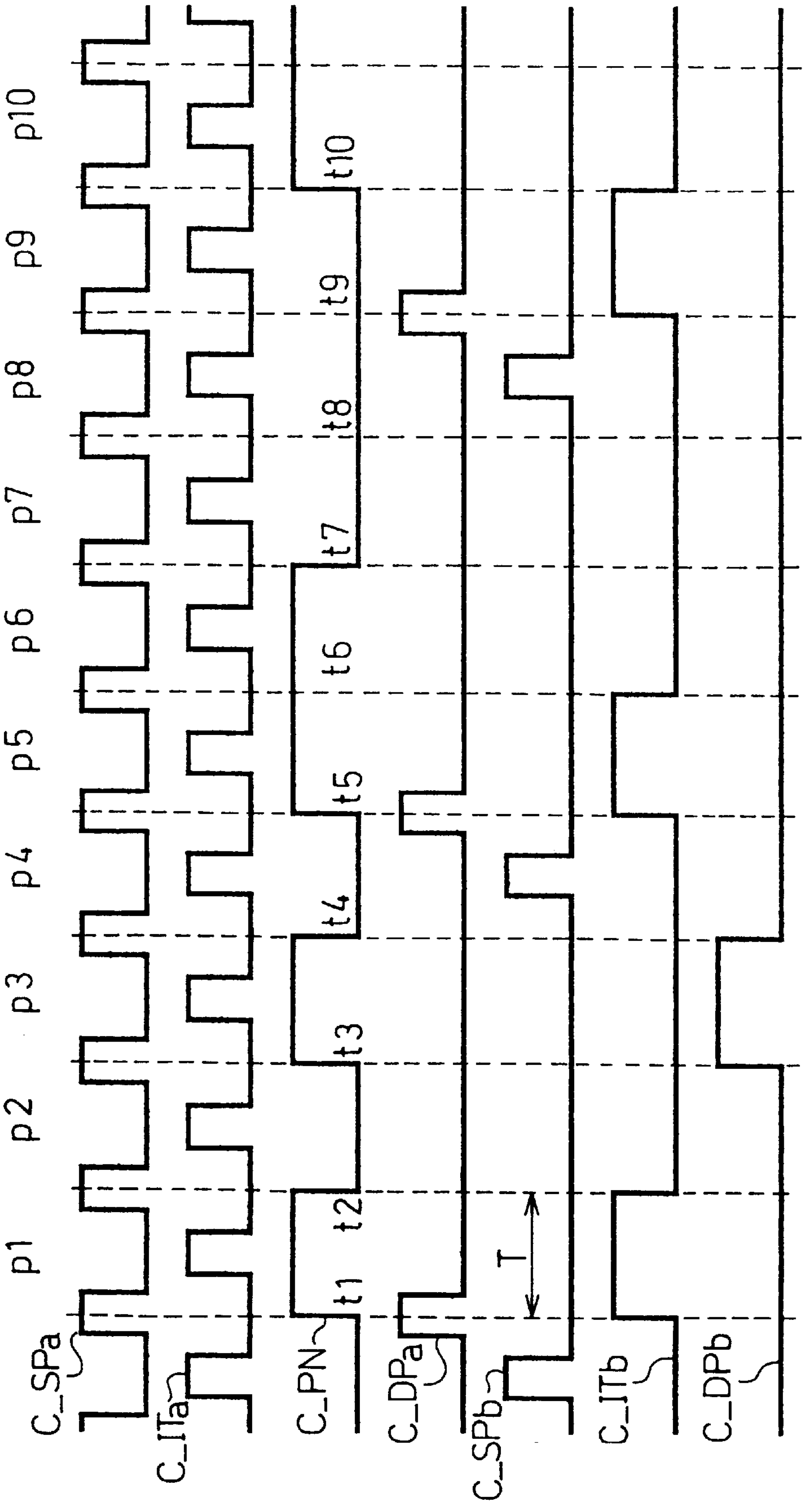
FIG. 3 is a timing chart showing the operation of the correlating device.

The following description will explain an embodiment of the present invention with reference to FIGS. 1 to 3. Specifically, a correlating device 1 of this embodiment is suitable for use as a sliding correlating device for synchronizing an input signal and a binary-code sequence, or a correlating device for demodulating spread data into the original form, for example, in spread spectrum communications. As illustrated in FIG. 1, the correlating device 1 can output a voltage Vout corresponding to the correlation between a binary-code sequence signal C__PN representing a binary-code sequence and an analog input voltage Vin as an analog input signal, with respect to time.

Here, the binary-code sequence signal C__PN represents a binary-code sequence involved in a correlation operation. A level given by a predetermined frequency fc corresponds to the respective values {p1, p2, . . . , pn} of the binary-code sequence. For example, in the case of the binary-code sequence signal C__PN shown in FIG. 3, the period between time points t1 and t2 corresponds to a value p1 of the binary-code sequence. In this example, since the value pi is "+1", the binary-code sequence signal C__PN is high level in this period. Meanwhile, the period between time points t2 and t3 corresponds to a value p2 of the binary-code sequence. Since the value p2 is "1", the binary-code sequence signal C__PN is low level in this period. For the sake of simplifying the explanation, it is assumed in the description hereinbelow that the sequence length n is 16. However, the sequence length is not necessarily limited to 16. In other words, the sequence length n and the values of respective binary codes constituting the binary-code sequence can be freely set.

As illustrated in FIG. 1, the correlating device 1 of this embodiment includes switched-capacitor-type analog signal integrators 11*a* and 11*b* connected in cascade. In this embodiment, two cascade-connected switched-capacitor-type analog signal integrators 11*a*, 11*b* are explained as an example for the sake of simplifying the explanation. However, the number of stages to be connected in cascade can be freely set according to applications. Here, the analog signal integrators 11*a*, 11*b* correspond to an integrating section recited in the scope of claims, and the analog signal integrator 11*b* also corresponds to a specific analog signal integrator.

The analog signal integrator 11*a* in the first stage includes a sampling circuit 12*a* for sampling the analog input voltage Vin as charge accumulated in a sampling capacitor C1*a*, and an integrating circuit 13*a* provided with an operational amplifier A1*a* and a feedback capacitor (integrating capacitor) C2*a*, for integrating the output of the sampling circuit 12*a*. More specifically, in the sampling circuit 12*a*, the analog input voltage Vin is applied to one of the terminals of the sampling capacitor C1*a* through a sampling switch SW1*a*, while an analog reference voltage Vref is applied to the other terminal through a sampling switch SW2*a* that interacts with the sampling switch SW1*a*.

On the other hand, in the integrating circuit 13*a*, one of the terminals of the feedback capacitor C2*a* is connected to the negative input terminal of the operational amplifier A1*a*, while the other terminal thereof is connected to the output terminal of the operational amplifier A1*a* as the output of the analog signal integrator A1*a*. Moreover, in order to refresh the analog signal integrator 11*a* by resetting the integrating charge accumulated in the feedback capacitor C2*a*, a dumping switch SW3*a* is provided between the electrodes of the feedback capacitor C2*a*. Furthermore, a switch SW5*a* is provided between the negative input terminal of the operational amplifier A1*a* and a terminal of the sampling capacitor C1*a*, beside the sampling switch SW1*a*. Additionally, a switch SW6*a* that interacts with the switch SW5*a* is placed between the positive input terminal and the other terminal of the sampling capacitor C1*a*, beside the sampling switch SW2*a*. The analog reference voltage Vref is applied to the positive input terminal of the operational amplifier A1*a*.

The switches SW1*a* to SW6*a* are controlled by control signal C__SPa, C__ITa, or C__DPa from a timing control circuit 2. The timing control circuit 2 is relatively easily constructed by, for example, a sequential circuit which operates according to a reference clock of a predetermined frequency.

In addition, in the integrating circuit 13*a* of the analog signal integrator 11*a* in the first stage, a multiplexer 14*a* for switching the sign of charge supplied to the operational amplifier A1*a* is provided between the switches SW5*a*, SW6*a* and the operational amplifier A1*a*. The multiplexer 14*a* has switches SW7*a*, SW8*a* for outputting one of two inputs according to the binary-code sequence signal C__PN. The common contact of the switch SW7*a* is connected to the negative input terminal of the operational amplifier A1*a*. One of individual contacts of the switch SW7*a* is connected to the switch SW5*a*, and the other individual contact is connected to the switch SW6*a*. Similarly, the common contact of the switch SW8*a* is connected to the positive input terminal of the operational amplifier A1*a*, and individual contacts are connected to the switches SW5*a*, SW6*a*, respectively. The switches SW7*a*, SW8*a* interact according to the binary-code sequence signal C_PN. When the binary-code sequence signal is high level, the switch SW7*a* connects the switch SW6*a* and the negative input terminal, and the switch SW8*a* connects the switch SW5*a* and the positive input terminal. On the other hand, when the binary-code sequence signal is low level, the switch SW7*a* connects the switch SW5*a* and the negative input terminal, and the switch SW8*a* connects the switch SW6*a* and the positive input terminal.

For example, as shown in FIG. 2, each of the switches SW1*a* to SW8*a* is a switch which has the CMOS structure including a PMOS transistor P1 and an NMOS transistor N1, and has an inverter I1 for inverting a control signal applied to the gate of the NMOS transistor N1 and for applying the inverted signal to the gate of the PMOS transistor P1. For instance, when the NMOS transistor N1 has a gate length of 1 [$\mu$m] and a gate width of 2 [$\mu$m], and the PMOS transistor has a gate length of 1 [$\mu$m] and a gate width of 4 [$\mu$m], the sum of the gate-source parasitic capacitances of the two MOS transistors P1, N1 is substantially about 5 to 10 [fF].

Meanwhile, the analog signal integrator 11*b* after the first stage has substantially the same structure as that of the analog signal integrator 11*a* in the first stage. For the sake of simplifying the explanation, the members of the analog signal integrator 11*b* which have the same functions as those of the analog signal integrator 11*a* in the first stage will be represented by the reference codes including an alphabetical character "b" at the end in place of "a", and the only differences therebetween will be explained. In the case when a stage (position) in which a certain member is located is not particularly limited and when the certain members in the respective stages are referred to generally, the alphabetical character at the end of the reference code is omitted. Namely, for example, the operational amplifiers A1*a*, A1*b* . . . are referred to as the "operational amplifier A1".

More specifically, differently from the analog signal integrator 11*a* in the first stage, the multiplexer 14*a* is not provided in the analog signal integrator 11*b* after the first stage. In accordance with the omission of the multiplexer 14*a*, the switches SW2*a* and SW6*a*, which are provided in the analog signal integrator 11*a* in the first stage, are omitted in the analog signal integrator 11*b* after the first stage. Therefore, an output voltage Vmid of the analog signal integrator 11*a* in the first stage is applied to one of the terminals of a sampling capacitor C1*b* through a sampling switch SW1*b*, and the analog reference voltage Vref is applied to the other terminal thereof. Besides, the analog reference voltage Vref is directly applied to the positive input terminal of the operational amplifier A1*b*.

Moreover, as to be described hereinbelow, a control signal C_SPb, C_ITb, or C_DPb applied to the analog signal integrator 11*b* is different from the control signal to be fed to the analog signal integrator 11*a* in the first stage. Accordingly, the analog signal integrator 11*a* after the first stage samples the output of the analog signal integrator 11*a* in the first stage at a reset cycle of the analog signal integrator 11*a* in the first stage, and outputs the sum of the respective sampled values. Consequently, if the reset cycle of the analog signal integrator 11*a* in the first stage is set N times the sampling cycle of analog signal integrator 11*a* in the first stage, the sampling cycle of the analog signal integrator 11*b* after the first stage is N times the sampling cycle in the first stage. As to be described later, although the value of N can be freely set so as to reduce clock field through noise, N is set at 4 in the explanation hereinbelow for the sake of simplifying explanation.

Referring now to the timing chart shown in FIG. 3, the following description will explain the correlation operation of the correlating device 1 having the above-mentioned structure. In FIG. 3, T represents the cycle of the binary-code sequence signal C_PN, and the values {p1, p2, . . . pn} of the binary-code sequence correspond to each cycle.

At the start point (point t1) of the binary-code sequence, the timing control circuit 2 applies a highlevel dump control signal C_DPa to the analog signal integrator 11*a* in the first stage. As a result, a dumping switch SW3*a* connected to both the terminals of the feedback capacitor C2*a* is closed, and the integrating charge accumulated until then is discharged from the feedback capacitor C2*a*.

The sampling switches SW1*a* and SW2*a* of the sampling circuit 12*a* are closed during a period during which the sampling control signal C_SPa is high level. In this period, charge is accumulated in the sampling capacitor C1*a* so that the voltage across the sampling capacitor C1*a* is equal to the difference between the analog input voltage Vin and the analog reference voltage Vref.

On the other hand, when the sampling control signal C_SPa is low level, the sampling switches SW1*a* and SW2*a* are open. As a result, the amount of charge accumulated in the sampling capacitor C1*a* at the time both of the sampling switches SW1*a* and SW2*a* become open (at the time of sampling) are retained during a period (hold period) in which both of the sampling switches SW1*a* and SW2*a* are open.

Here, the cycle of the sampling control signal C_SPa is set to be equal to the cycle T of the binary-code sequence signal C_PN. Accordingly, the sampling circuit 12*a* repeats sampling and holding of the analog input voltage Vin at the sampling cycle T.

Consequently, the sampling circuit 12*a* can sample an amount of charge proportional to the analog input voltage Vin(i) at a discrete time i in the sampling capacitor C1*a*. The discrete time i indicates an open time which comes every sampling cycle T. The analog input voltage Vin(i) represents the analog input voltage Vin at the discrete time i.

Meanwhile, as shown in FIG. 3, the timing control circuit 2 changes the integration control signal C_ITa into high level during the hold period. In accordance with this change, in the integrating circuit 13*a* of the analog signal integrator 11*a*, both of the switches SW5*a* and SW6*a* are closed. Here, after applying to the multiplexer 14*a* the binary-code sequence signal C_PN corresponding to the present cycle, the integration control signal C_STa changes into high level. This determines the sign of charge in applying the charge accumulated in the sampling capacitor C1*a* to the operational amplifier A1*a*.

For instance, in the example shown in FIG. 3, the first value p1 of the binary-code sequence is "+1". Therefore, the binary-code sequence signal C_PN is kept in high level during a period corresponding to p1 (the period between t1 and t2). As a result, contrary to the above-mentioned case, the switch SW7*a* of the multiplexer 14*a* selects the terminal connected to the switch SW6*a*, while the switch SW8*a* selects the terminal connected to the switch SW5*a*. Thus, when the switches SW5*a* and SW6*a* are closed, the charge accumulated in the sampling capacitor C1*a* is applied to the operational amplifier A1*a* without changing the sign thereof.

Moreover, in the example shown in FIG. 3, the second value p2 of the binary-code sequence is "−1". Therefore, the binary-code sequence signal C_PN of low level is applied during a period corresponding to p2 (the period between t2 and t3). As a result, the switch SW7*a* of the multiplexer 14*a* selects the terminal connected to the switch SW5*a*, while the switch SW8*a* selects the terminal connected to the switch SW6*a*. Consequently, the charge accumulated in the sampling capacitor C1*a* is switched to the opposite sign, and applied to the operational amplifier A1*a*.

Thus, when the switches SW5*a* and SW6*a* are closed according to the integration control signal C_STa, an amount of charge accumulated in the sampling capacitor C1*a* possess a sign according to the binary-code sequence signal C_PN, is applied to the operational amplifier A1*a*, and added to the charge accumulated in the feedback capacitor C2*a*. As a result, the output voltage Vmid of the integrating circuit 13*a* is increased by an amount corresponding to the product of the value of the analog input voltage Vin(i) at the time of sampling and the value of the binary-code sequence in the present cycle, and the sum of products of the analog input voltage Vin(i) and the binary-code sequence is calculated.

The output voltage Vmid of the integrating circuit 13*a* is given as an output of the analog signal integrator 11*a* to the analog signal integrator 11*b* in the second stage, and is also output as a voltage indicating the progress in the correlation operation from a terminal "mid" corresponding to a partial sequence correlation output terminal recited in the claims.

Here, when the analog signal integrator 11*a* in the first stage repeats sampling and holing a predetermined number of times N, for example, four times, and the output voltage Vmid in the final cycle is sampled by the analog signal integrator 11*b* in the second stage, the analog signal integrator 11*a* is reset.

More specifically, as illustrated in FIG. 3, in the final cycle (the period between t4 and t5), the timing control circuit 2 applies a sampling control signal C_SPb to the analog signal integrator 11*b* in the second stage so as to instruct sampling. The sampling point, i.e., the decay point of the sampling control signal C_SPb is set within a period during which the output voltage Vmid is stable, for example, in the vicinity of the decay point of the integration control signal C_STa, or a just before the rise time of a dump control signal C_DPa, to be described later.

When the sampling control signal C_SPb decays, the sampling switch SW1*b* of the sampling circuit 12*b* of the analog signal integrator 11*b* in the second stage is open. As a result, the output voltage Vmid in the final cycle is sampled as the amount of charge accumulated in the sampling capacitor C1*b*.

After the sampling control signal C_SPb decays, the timing control circuit 2 applies a dump control signal C_DPa of high level to the analog signal integrator 11*a* so as to instruct resetting. According to the instruction, the dumping switch SW3*a* of the analog signal integrator 11*a* in the first stage is closed, and the integrating charge accumulated in the feedback capacitor C2*a* is reset.

Besides, the dump control signal C_DPa is given in such timing that it changes into high level after the analog signal integrator 11*b* in the second stage performs sampling and changes into low level before the control signal C_STa to be applied to the analog signal integrator 11*a* changes into high level, for example, in the same timing as the sampling control signal S_SPa.

Here, as illustrated in FIG. 3, in the analog signal integrator 11*b* in the second stage, similarly to the analog signal integrator 11*a* in the first stage, the integration control signal C_ITb is high level during the hold period (the period during which the sampling switch SW1*b* is open). Then, the switch SW5*b* is closed. As a result, the charge sampled in the sampling capacitor C1*b* is accumulated in a feedback capacitor C2*b*.

Therefore, the analog signal integrator 11*b* in the second stage can sample the output voltage Vmid just before resetting, and integrate the sampled value every reset cycle of the analog signal integrator 11*a* in the previous stage. As a result, the output voltage Vout of the analog signal integrator 11*b* is increased by an amount proportional to the output voltage Vmid whenever the analog signal integrator 11*a* is reset.

Moreover, the timing control circuit 2 applies the dump control signal C_DPb every time the analog signal integrator 11*b* performs sampling a predetermined number of times (four times in this case). However, the timing of application of the dump control signal C_DPb is set so that the first dump control signal C_DPb is applied in the period between the end of the previous binary-code sequence signal and the first sampling performed by the analog signal integrator 11*b*.

In this embodiment, the analog signal integrator 11*b* is the analog signal integrator in the final stage. Therefore, the cycle of the dump control signal C_DPb coincides with the cycle of the binary-code sequence. Accordingly, the sampling capacitor C1*b* is reset every time the binary-code sequence is repeated, and the output voltage Vout of the analog signal integrator 11*b* at the end of the binary-code sequence shows the correlation between the binary-code sequence and the analog input voltage Vin.

Figure 11:
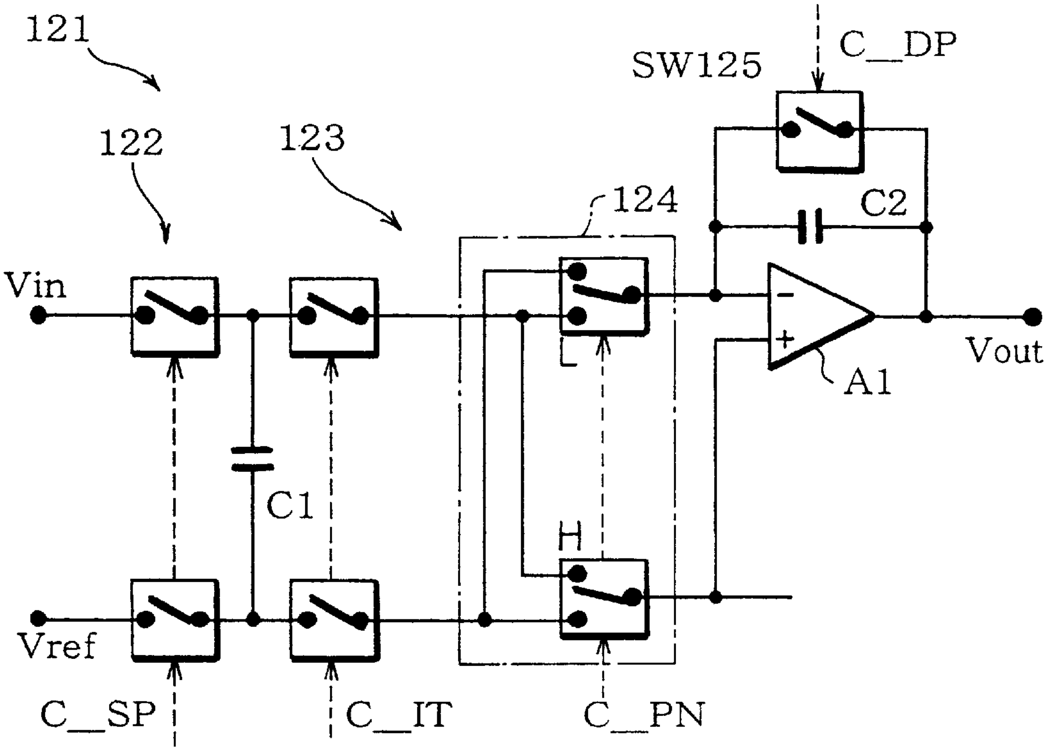
FIG. 11 is a circuit diagram showing an essential section of a correlating device using the switched-capecitor-type analog signal integrator, in accordance with another conventional example.
Figure 12:
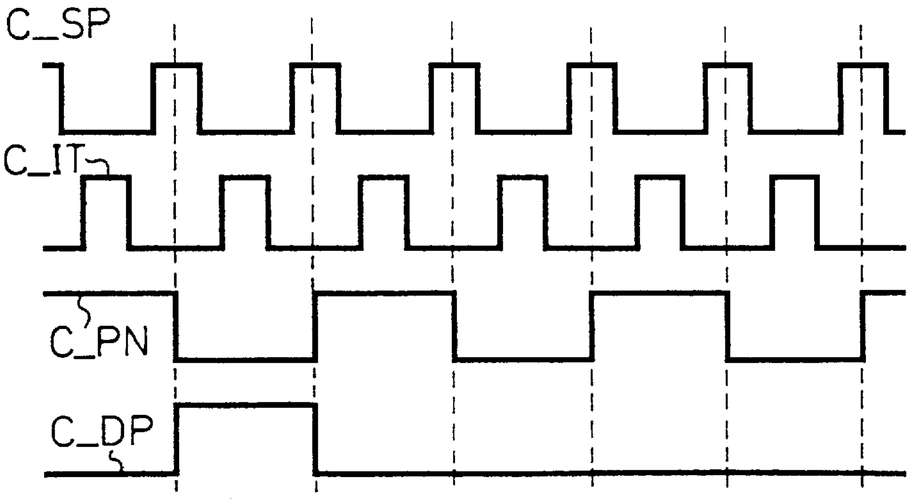
FIG. 12 is a timing chart showing the operation of the correlating device.

Here, like the conventional correlating device 121 shown in FIG. 11, if a correlating device is constructed by a single-stage analog signal integrator 123, the analog signal integrator 123 can not be reset until the correlation with the binary-code sequence is calculated once. Therefore, the number of times, N, sampling is to be performed per reset cycle is 16 that is equal to the sequence length. Therefore, considering the clock field through noise with respect to input, when the sampling capacitance C1 is set at 1 [pF], if Vmax in the above-mentioned equation (1) is not higher than 1 [V], the feedback capacitance C2 needs to be 16 [pF] or more.

On the other hand, in the correlating device 1 of this embodiment, the analog signal integrator 11*a* in the first stage is reset every time sampling and integration are performed four times. Moreover, the analog signal integrator 11*b* in the second stage performs sampling whenever the analog signal integrator 11*a* in the first stage is reset, and is reset every time sampling and integration are repeated four times.

Therefore, in the analog signal integrators 11*a*, 11*b* in the respective stages, the number of times, N, sampling is to be performed per reset cycle is reduced to one quarter of that of the conventional analog signal integrator. Hence, the capacitance of feedback capacitor C2 required in this embodiment is $C1/C2>1/4$ according to a calculation based on the same conditions as those used for calculating the capacitance of the conventional feedback capacitor C2. Accordingly, the capacitance of each feedback capacitor C2 is 4 [pF] or more, and thus reduced to 25 percent of the conventional capacitance.

Here, since the power consumed by the operational amplifier A1 is substantially proportional to the load capacitance, the power consumed by each analog signal integrator 11 is 25 percent of the power consumed by the conventional analog signal integrator 123. As a result, the overall power consumed by the correlating device 1 is reduced to 50 percent of the conventional power consumption.

Additionally, in general, it is difficult to integrate the large capacitances. However, the above-mentioned structure can reduce the capacitance of each feedback capacitor C2. Thus, the correlating device 1 can be relatively easily formed on an integrated circuit.

By the way, the correlating device 1 of this embodiment is provided with the terminal "mid", and the output voltage Vmid of the analog signal integrator 11*a* in the first stage is output from the terminal "mid". The terminal "mid" is also connected to the timing control circuit 2. The timing control circuit 2 compares the output voltage Vmid and a predetermined threshold value, and determines whether the correlation operation is to be interrupted.

More specifically, the output voltage Vmid indicates the correlation between the analog input voltage Vin and the binary-code sequence in a period before the analog signal integrator 11*a* is reset. In this embodiment, since the analog signal integrator 11*a* is reset every time sampling is performed four times, the output voltage Vmid shows the correlation between the analog input voltage Vin and a partial sequence with a sequence length 4 of the binary-code sequence.

Here, when determining whether the correlation between the analog input voltage Vin and the binary-code sequence is not less than 90 percent of the maximum value, the correlation with each partial sequence needs to be 60 percent or more. Assuming that the correlation with a certain partial sequence is less than 60 percent, even if the analog input voltage Vin and the remaining partial sequences have the maximum correlation, the correlation between the analog input voltage Vin and the entire binary-code sequence becomes less than 90 percent.

Therefore, a threshold voltage corresponding to 60 percent of the maximum correlation with the partial sequence is set in the timing control circuit 2 in advance, and if the output voltage Vmid is lower than the threshold voltage, the timing control circuit 2 interrupts the correlation operation by, for example, outputting a signal indicating that the correlation with the entire binary-code sequence is less than 90 percent. With this arrangement, it is possible to predict the value of correlation to a certain extent before calculating the correlation with the entire binary-code sequence, thereby shortening the processing time.

Embodiment 2

According to Embodiment 1, power is always supplied to the operational amplifier A1 of the analog signal integrator 11 in each stage. By contrast, Embodiment 2 explains a correlating device capable of further reducing the power consumption by producing a period during which the supply of power to the operational amplifier A1 is cut in the analog signal integrator in a stage after the first stage.

Figure 4:
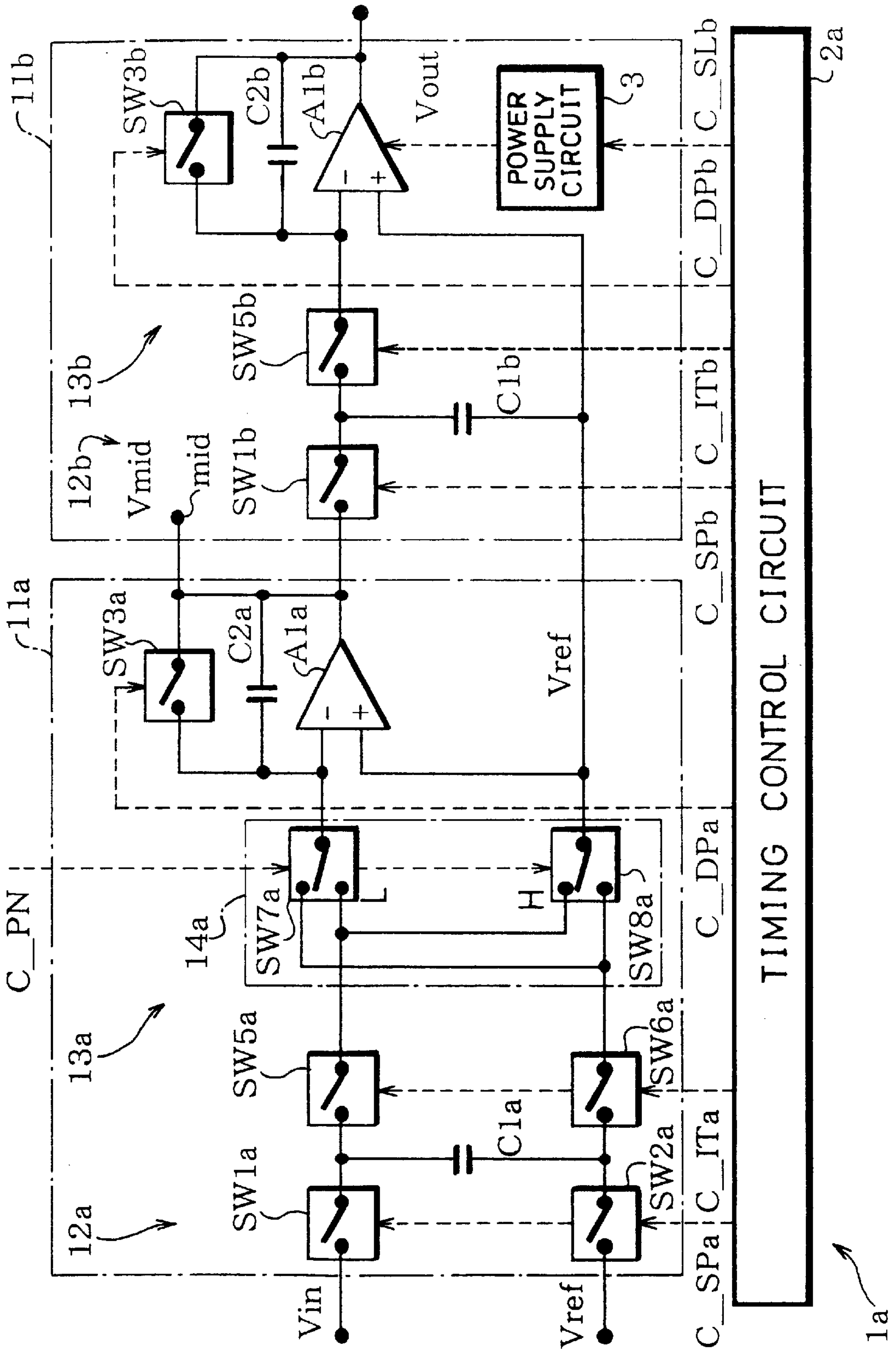
FIG. 4 is a circuit diagram showing the structure of an essential section of a correlating device according to another embodiment of the present invention.

More specifically, as illustrated in FIG. 4, a correlating device 1*a* of Embodiment 2 includes a power supply circuit (power supply terminating section) 3 for controlling the supply of power to the analog signal integrator 11*b* in a stage other than first stage, as well as the structure of the correlating device 1 shown in FIG. 1. Moreover, a timing control circuit 2*a* is provided in place of the timing control circuit 2. The timing control circuit 2*a* can output a power control signal C__SLb to the power supply circuit 3 in addition to the respective control signals output by the timing control circuit 2.

Figure 5:
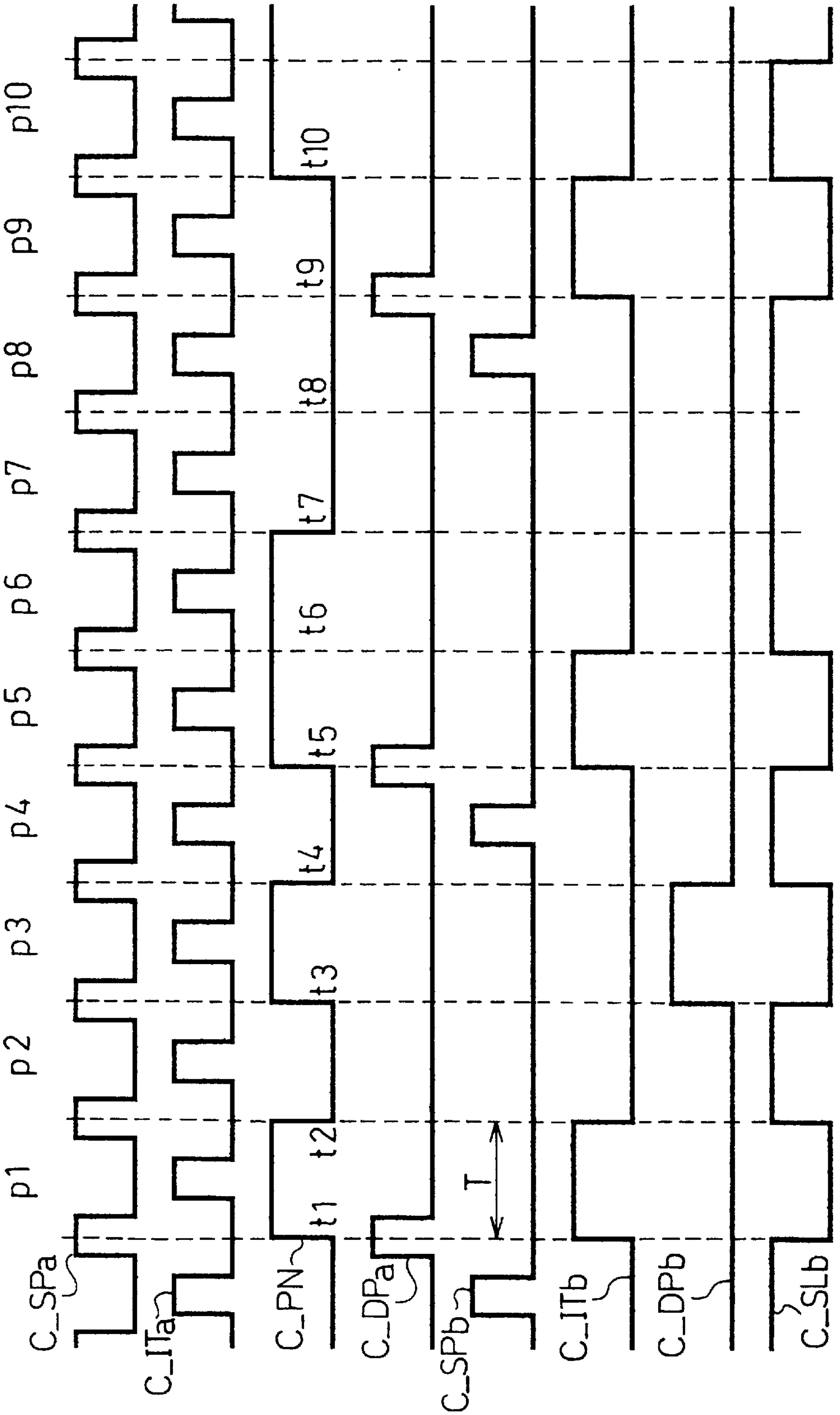
FIG. 5 is a timing chart showing the operation of the correlating device.

More specifically, as illustrated in FIG. 5, the timing control circuit 2*a* outputs a power control signal C__SLb of high level in a down period during which the analog signal integrator 11*b* in the second stage performs neither the reset operation nor the integration operation, i.e., a period during which both of the integration control signal C__ITb and the dump control signal C__DPb are low level. In a period during which the power control signal C__SLb is high level, the power supply circuit 3 terminates the supply of power to the operational amplifier A1*b* by, for example, cutting the bias current of the operational amplifier A1*b* of the analog signal integrator 11*b*. In this period, since the amount of charge retained in the feedback capacitor C2*b* does not vary, even if the supply of power to the operational amplifier A1*b* is stopped, the output voltage Vout does not vary. Therefore, the result of the operation of the correlating device 1 is not affected.

On the other hand, in a period during which the operational amplifier A1*b* must perform an amplifying function, i.e., during the resetting operation and integration operation, the power control signal C__SLb becomes low level, and the power supply circuit 3 supplies power to the operational amplifier A1*b*. Thus, the operational amplifier A1*b* can perform the amplifying function without any hindrance.

Hence, in this embodiment, the period during which the power is supplied to the operational amplifier A1*b* is shortened as compared to Embodiment 1. It is therefore possible to reduce the power supplied to the operational amplifier A1*b* to around 37.5 percent on average.

Furthermore, the sampling frequency of the analog signal integrator 11*b* in the second stage is lowered as compared to that in the first stage. Consequently, even if the operation speed is lowered due to the intermittent supply of power, the analog signal integrator 11*b* can integrate the sampled value without any hindrance.

Embodiment 3

In Embodiments 1 and 2, the analog signal integrator in each stage is constructed by using a single-ended operational amplifier. On the other hand, in this embodiment, each analog signal integrator is constructed by using a fully differential operational amplifier.

Figure 6:
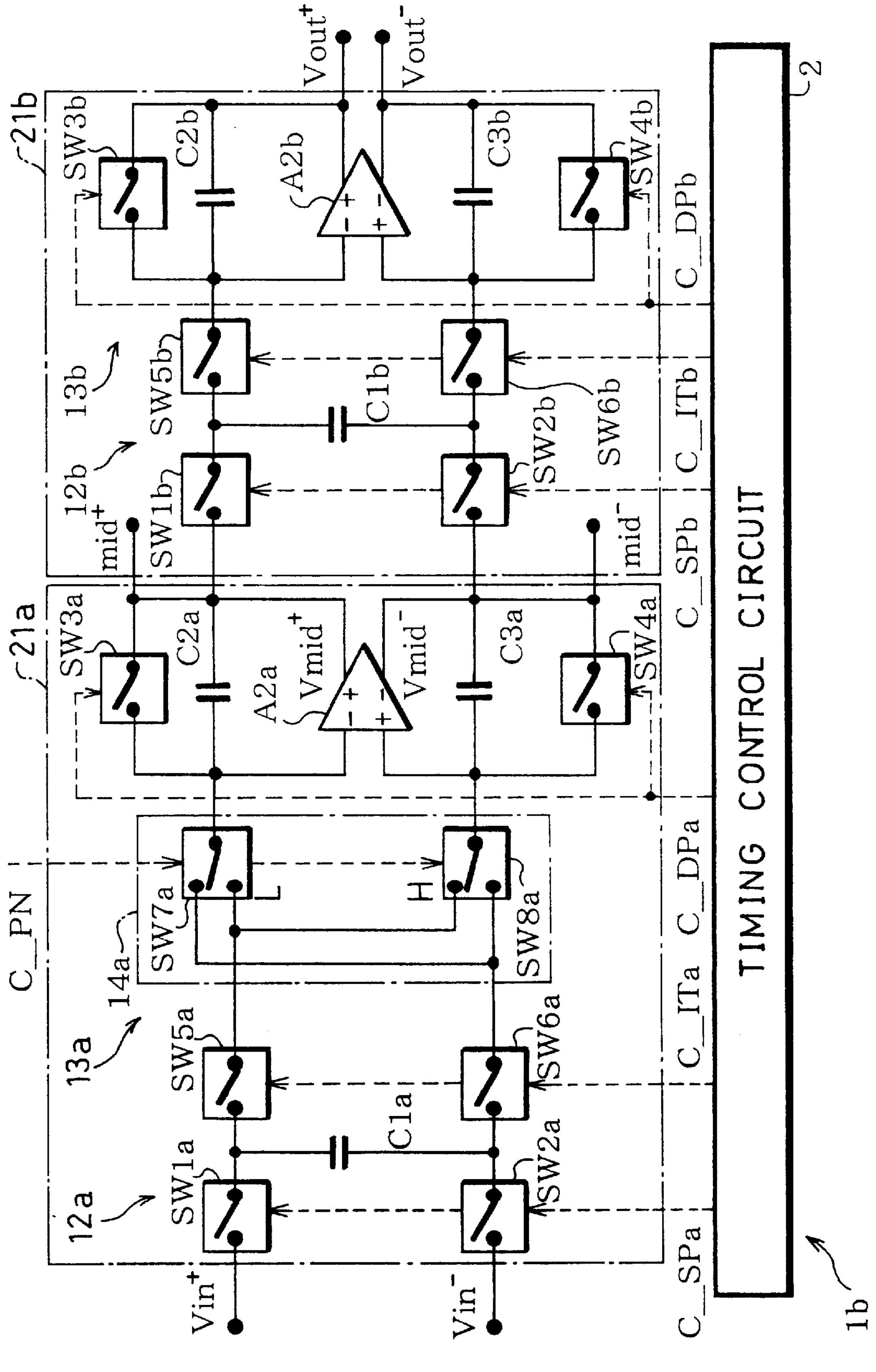
FIG. 6 is a circuit diagram showing the structure of an essential section of a correlating device according to still another embodiment of the present invention.

As illustrated in FIG. 6, the correlating device 1*b* of this embodiment includes an analog signal integrator 21 having a fully differential operational amplifier A2, instead of each analog signal integrator 11 shown in FIG. 1. Therefore, in the analog signal integrator 21 in each stage, a feedback capacitor C3 and a switch SW4 are positioned so that the feedback capacitor C3 and switch SW4 connected to the negative output terminal and a capacitor C2 and a switch SW3 connected to the positive output terminal are symmetrical to each other. Moreover, switches SW2 and SW6 are provided even in an analog signal integrator 21*b* in the second stage. The switches SW2, SW4, SW6, and SW8 located on the negative output terminal side of the operational amplifier A2 act interactively with SW1, SW3, SW5 and SW7 located on the positive output side, according to an instruction of the timing control circuit 2. Furthermore, a differential signal given by positive and negative input voltages is applied as an input signal to each analog signal integrator 11. The analog signal integrator 11 outputs positive and negative output voltages so that the differential signal given by these outputs serves as an output signal.

Consequently, the correlating device 1*b* can output the correlation between the binary-code sequence signal C__PN and a differential signal ($Vin^+ - Vin^-$) given by analog input voltages $Vin^+$ and $Vin^-$ as a differential signal ($Vout^+ - Vout^-$) given by output voltages $Vout^+$ and $Vout^-$. Thus, since the correlating device 1*b* processes the signals based on the full difference, it is possible to increase the dynamic range of the correlating device 1*b*, and improve the S/N ratio.

Embodiment 4

Embodiments 1 to 3 explain the structures in which the number of stages of the analog signal integrators is 2. However, the number of stages is not necessarily limited to 2. If a plurality of analog signal integrators are connected in cascade, the same effects as those produced in Embodiment 4 can be obtained. Embodiment 4 will explain a structure in which three analog signal integrators are connected in cascade in the correlating device 1 shown in FIG. 1 as an example of the structure including more than two stages of analog signal integrators.

Figure 7:
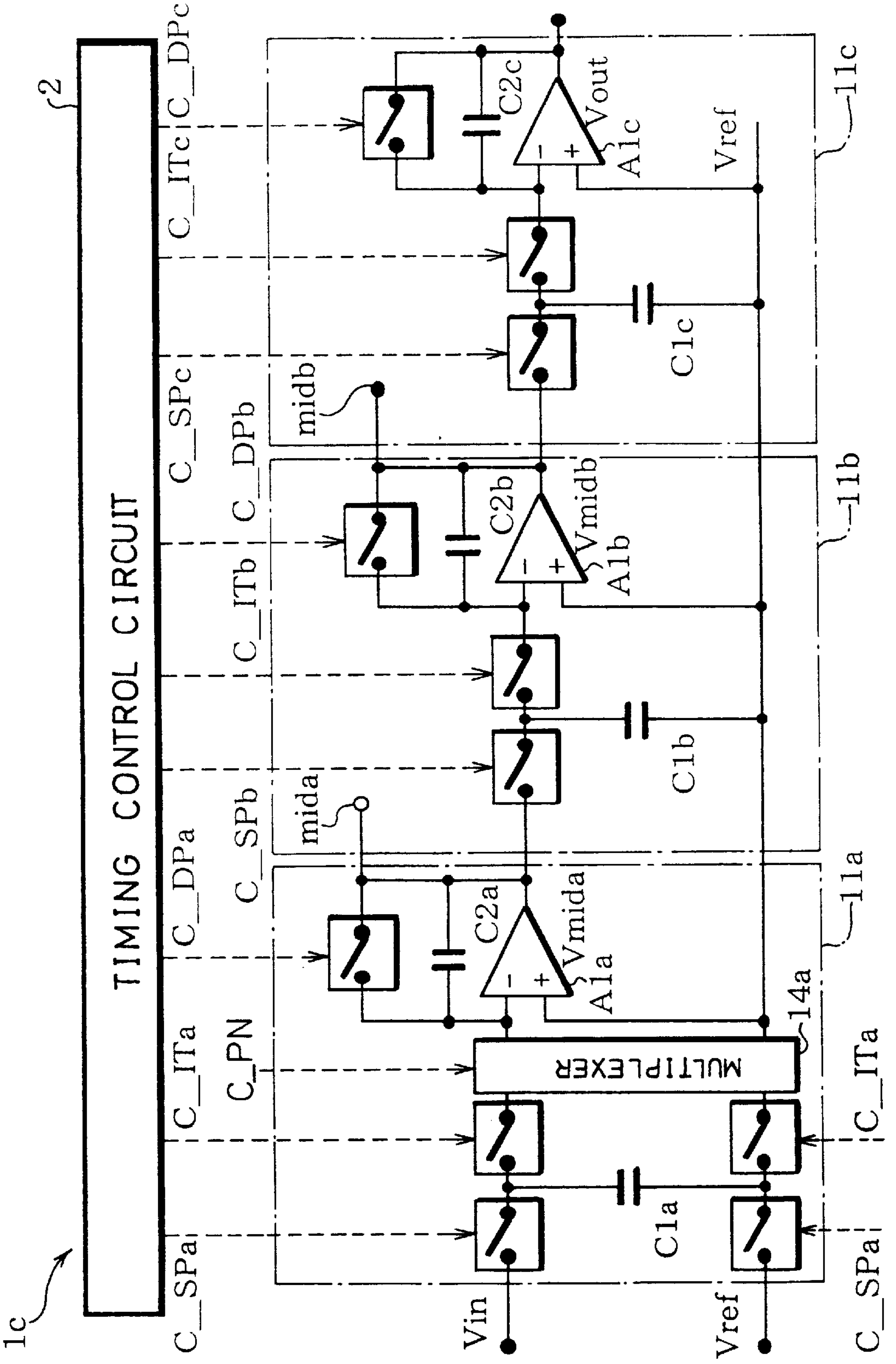
FIG. 7 is a circuit diagram showing the structure of an essential section of a correlating device according to yet another embodiment of the present invention.

As illustrated in FIG. 7, a correlating device 1*c* of this embodiment includes three stages of analog signal integrators 11*a* to 11*c*. Each analog signal integrator 11 has the same structure as the analog signal integrator 11 of Embodiment 1. More specifically, only the analog signal integrator 11*a* in the first stage is provided with the multiplexer 14*a*. Namely, the multiplexer 14 and switches SW2, SW6 are omitted in the analog signal integrators 11*b* and 11*c* after the first stage. In addition, the output voltages Vmida, Vmidb of the analog signal integrators 11*a*, 11*b* in the stages other than the final stage are output from terminals "mida" and "midb", respectively, and compared with a predetermined threshold voltage.

Here, the number of times sampling is to be performed per reset cycle in the analog signal integrators 11*a*, 11*b* in the first and second stages is Na times and Nb times, respectively. Denoting the sequence length of the binary-code sequence as n, the number of times sampling is performed per reset cycle in the analog signal integrator 11*c* in the third stage, i.e., Nc, is n/(Na×Nb) times.

In this case, the analog signal integrator 11*a* in the first stage samples the analog input voltage Vin at a sampling frequency fc, integrates the sampled value, and outputs the resultant value. The analog signal integrator 11*b* in the second stage samples the output voltage Vmida of the analog signal integrator 11*a* in the first stage at a sampling frequency fc/Na, and integrates the sampled value. Similarly, the analog signal integrator 11*c* in the third stage samples the output voltage Vmidb of the previous stage at a sampling frequency fc/(Na×Nb), and integrates the sampled value. Besides, the analog signal integrator 11 in each stage is reset every binary-code sequence, or every time sampling is performed by the analog signal integrator 11 in the next stage.

Consequently, the output voltage Vout of the analog signal integrator in the final stage is expressed as:

$$Vout-Vref=(C1a/C2a)\times(C1b/C2b)\times(C1c/C2c)\times\Sigma(Vin(i)-Vref)\cdot pi \quad (2)$$

where Vin(i) is the analog input voltage Vin at the discrete time i, pi is the value of a binary-code sequence corresponding to Vin(i), and C1*a* to C1*c* and C2*a* to C2*c* represent the capacitances of the sampling capacitors C1*a* to C1*c* and feedback capacitors C2*a* to C2*c*, respectively.

Here, for example, when the values of the respective capacitors are set so that $C1a/C2a=1/8$, $C1b/C2b=1/4$, and $C1c/C2c=1/4$, in equation (2), $(C1a/C2a)\times(C1b/C2b)\times(C1c/C2c)=1/128$. In this case, when the analog signal integrator 11*a* integrates the sampled value 128 times by assuming that Na=8 and Nb=4, the dynamic range of the output voltage Vout is equal to the dynamic range of the input voltage Vin.

In either case, the number of times, N, sampling is performed per reset cycle in each analog signal integrator 11 becomes much smaller than the sequence length, n, of the binary-code sequence. Consequently, if the capacitance of each sampling capacitor C1 and the range of voltage which can be output by each analog signal integrator 11 are made the same as those of the conventional structure so that the value of field through noise is the same as the conventional value, the feedback capacitor C2 of each analog signal integrator 11 is given by:

$$C2=c2\times N/n \quad (3)$$

where C2 is the capacitance of the conventional feedback capacitor C2.

Therefore, the power consumed by each analog signal integrator 11 is decreased to N/n of the conventional power consumption, thereby reducing significantly the overall power consumption of the correlating device 1*c*. The effect of reducing the power consumption is enhanced as the sequence length, n, of the binary-code sequence increases.

Here, in order to reduce the overall power consumption of the correlating device 1*c*, it is preferred to set the number of times, N, sampling is performed per reset cycle at the same value in the respective stages. However, in the case when the sequence length, n, can not be expressed by the product of a certain value as N, it is preferred in considering the operation speed, to be described later, that the number, N, is set so that the later the stage, the larger the number, N.

By the way, according to the above-described structure, the later the stage of the analog signal integrator 11, the lower the sampling frequency. For example, as mentioned above, if Na=8 and Nb=4, the sampling frequency of the analog signal integrator in the third stage is lowered to 1/32 of the sampling frequency fc in the first stage. Namely, since the operation speed is relatively low in the later stage, it is possible to use the analog signal integrator 11 of low power consumption. As a result, the overall power consumption of the correlating device 1*c* can be further reduced.

Moreover, the later the stage of the analog signal integrator 11, the larger the ratio of the down period (the period during which neither the reset operation nor the integration operation is performed). Thus, by providing the power supply circuit 3 as shown in Embodiment 2, the average overall power consumption of the correlating device 1 can be further reduced significantly. This power consumption reduction effect is also enhanced as the sequence length of the binary-code sequence increases.

Embodiment 5

Each of Embodiments 1 to 4 explains a correlating device for calculating the correlation between the binary-code sequence and the analog input voltage Vin. On the other hand, Embodiment 5 will explain a sliding correlating device for calculating the correlation between the analog input voltage Vin and the binary-code sequence while changing the phase difference therebetween, by using the above-mentioned correlating device. The sliding correlating device can be constructed by using any of the above-mentioned correlating devices. However, Embodiment 5 will be explained by illustrating an example using the correlating device 1 shown in 1.

Figure 8:
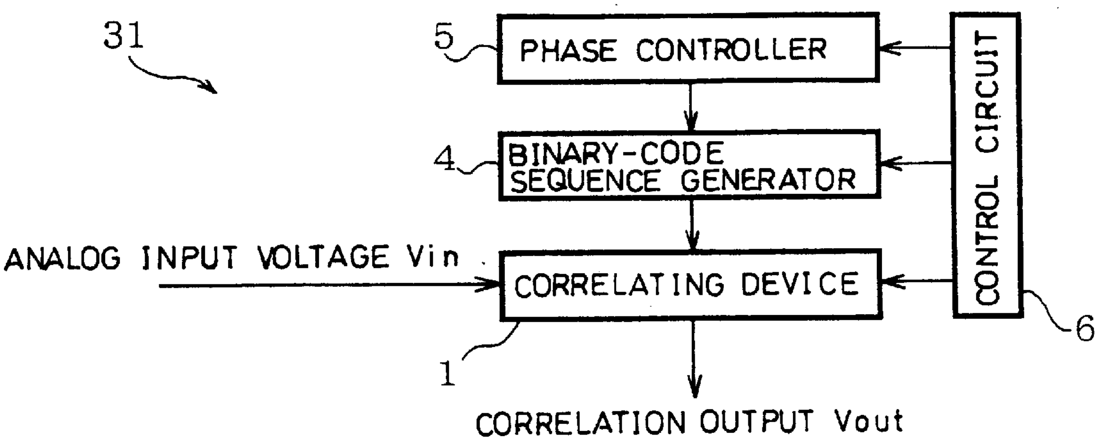
FIG. 8 is a block diagram showing the structure of an essential section of a sliding correlating device according to an embodiment of the present invention.
Figure 9:
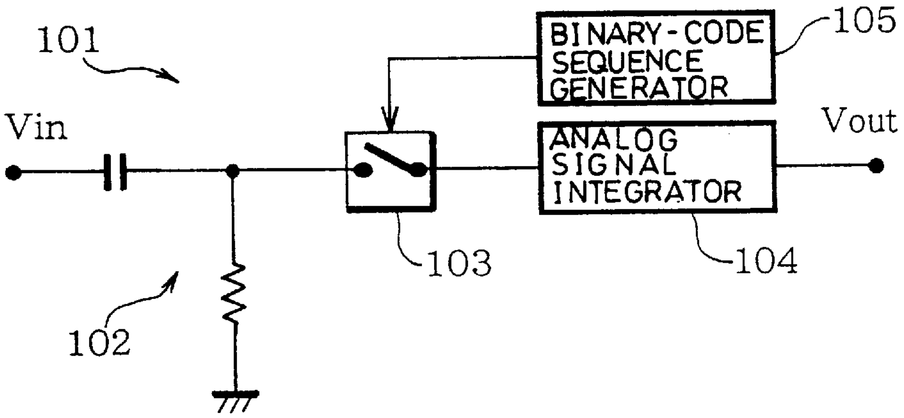
FIG. 9 is a circuit diagram showing an essential section of a correlating device realized by an analog circuit, in accordance with a conventional example.
Figure 10:
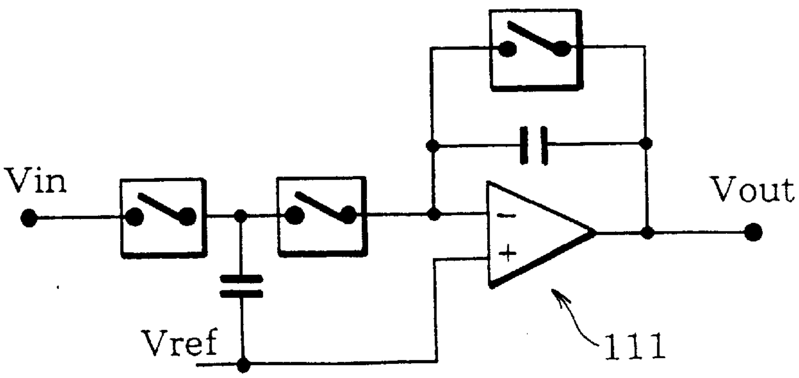
FIG. 10 is a circuit diagram showing a switched-capecitor-type analog signal integrator.

Specifically, as illustrated in FIG. 8, a sliding correlating device 31 of this embodiment includes the correlating device 1, a binary-code sequence generator 4 for generating a binary-code sequence according to a specified phase, a phase controller 5 for specifying a phase for the binary-code sequence generator 4, and a control circuit 6 for controlling the entire sliding correlating device 31.

The binary-code sequence generator 4 can output a binary-code sequence signal C__PN corresponding to a predetermined or a programmed binary-code sequence in a phase specified by the phase controller 5. The binary-code sequence generator 4 can be constructed relatively easily by, for example, a digital circuit including a decoder for sequentially specifying reading of a binary-code sequence at a frequency fc, and a memory for sequentially outputting the values of the stored binary-code sequence. Moreover, the binary-code sequence generator 4 may be arranged to generate a binary-code sequence according to a predetermined calculation process, instead of storing the binary-code sequence in advance. For example, in the case of spread spectrum communications, the binary-code sequence is a PN (Pseudo-Noise) code sequence, and is determined between the transmitter and receiver before communications.

In the sliding correlating device 31 of the above-mentioned structure, the correlating device 1 calculates the correlation between the analog input voltage Vin and the binary-code sequence generated by the binary-code sequence generator 4, as an output voltage Vout. When the correlation is calculated once, the control circuit 6 instructs the correlating device 1 to reset, and the phase-controller 5 to shift the phase of the binary-code sequence by an amount corresponding to one cycle. The binary-code sequence generator 4 generates a binary-code sequence based, for example, on the values before or after a binary-code sequence which was generated first in the previous time, according to the instruction from the phase controller 5.

Consequently, the sliding correlating device 31 can calculate the correlation between the binary-code sequence and analog input voltage Vin while changing the phase difference therebetween every correlation operation. It is thus possible to detect phases in which the correlation therebetween is the maximum, thereby synchronizing the analog input voltage and the binary-code sequence.

Here, even if the sequence length of the binary-code sequence becomes longer, the correlating device 1 of the above-mentioned structure can calculate the correlation at a high speed without lowering the operation accuracy or increasing the power consumption. Moreover, since the capacitance of the feedback capacitor C2 can be reduced, the correlating device 1 can be easily integrated. Hence, the correlating device 1 can be suitably used as, for example, a base band demodulator for W-CDMA (wide area-code division multiple access) used in mobile communications.

Besides, in a correlating device according to each of the above-described embodiments, the multiplexer 14*a* is disposed between the operational amplifier A1*a* (A2*a*) and the switches SW5*a*, SW6*a*. However, the position of the multiplexer 14*a* is not necessarily limited to such a location. For instance, the multiplexer 14*a* can be positioned between the sampling circuit 12*a* and the switches SW5*a*, SW6*a*, or in the stage before the sampling circuit 12*a*. It is also possible to apply the analog input voltage Vin of a sign corresponding to the value of the binary-code sequence to the sampling circuit 12*a*, instead of providing the multiplexer 14*a*. In either of the cases, if the sign of charge to be accumulated in the feedback capacitor C2*a* can be set according to the value of the binary-code sequence, the same effects as those of the above-described embodiments can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A correlating device for calculating a correlation between an analog input signal and a binary-code sequence with respect to time, comprising an integrating section provided with integrating capacitors for accumulating charge according to an integral value, for integrating an amount of charge corresponding to the analog input signal, said charge having a sign corresponding to the binary-code sequence, wherein said integrating section comprises a plurality of switched-capacitor-type analog signal integrators connected to each other in cascade, and charge accumulated in an integrating capacitor of each switched-capacitor-type analog signal integrator is reset every time sampling is performed in a next stage.

2. The correlating device as set forth in claim 1, further comprising a partial sequence correlation output terminal connected to an output of at least one of said analog signal integrators, which is located in a stage other than a final stage.

3. The correlating device as set forth in claim 1, further comprising a power supply terminating section for terminating supply of power to at least one specific analog signal integrator among said analog signal integrators, which is located in a stage other than a first stage, in a down period during which said specific analog signal integrator does not perform neither an integration operation nor an initialization operation.

4. The correlating device as set forth in claim 3, wherein said power supply terminating section cuts a bias current of said specific analog signal integrator when terminating the supply of power.

5. The correlating device as set forth in claim 1, wherein said analog signal integrator includes a fully differential operational amplifier for producing a differential input and a differential output.

6. The correlating device as set forth in claim 1, wherein said integrating section includes a multiplexer for selectively outputting one of a voltage corresponding to the analog input signal and a voltage of a polarity opposite to said voltage, according to the binary-code sequence.

7. The correlating device as set forth in claim 6, wherein said integrating section has a sampling capacitor across which the voltage corresponding to the analog input signal is applied, and said multiplexer connects selectively one of terminals of said sampling capacitors to the integrating capacitor of said analog signal integrator in a first stage, according to the binary-code signal.

8. A sliding correlating device comprising:

a code generator for generating a binary-code sequence according to a specified phase;

a correlating device for calculating a correlation between an analog input signal and the binary-code sequence with respect to time; and a control section for controlling said correlating device to calculate a correlation between the analog input signal and each phase of the binary-code sequence with respect to time while shifting the phase of the binary-code sequence, wherein said correlating device comprises an integrating section provided with integrating capacitors for accumulating charge according to an integral value, for integrating an amount of charge corresponding to the analog input signal, said charge having a sign corresponding to the binary-code sequence, and said integrating section comprises a plurality of switched-capacitor-type analog signal integrators connected to each other in cascade, and charge accumulated in an integrating capacitor of each switched-capacitor-type analog signal integrator is reset every time sampling is performed in a next stage.

9. The sliding correlating device as set forth in claim 8, further comprising a partial sequence correlation output terminal connected to an output of at least one of said analog signal integrators, which is located in a stage other than a final stage.

10. The sliding correlating device as set forth in claim 8, further comprising a power supply terminating section for terminating supply of power to at least one specific analog signal integrator among said analog signal integrators, which is located in a stage other than a first stage, in a down period during which said specific analog signal integrator does not perform neither an integration operation nor an initialization operation.

11. The sliding correlating device as set forth in claim 8, wherein said analog signal integrator includes a fully differential operational amplifier for producing a differential input and a differential output.

* * * * *